(12) United States Patent
Kenkel et al.

(10) Patent No.: US 10,971,805 B2
(45) Date of Patent: Apr. 6, 2021

(54) WRIST-WORN ELECTRONIC DEVICE WITH HOUSING-BASED LOOP ANTENNA

(71) Applicant: Garmin Switzerland GmbH, Schaffhausen (CH)

(72) Inventors: John M. Kenkel, Kansas City, MO (US); Abu T. Sayem, Overland Park, KS (US); Ting-Ying Chen, New Taipei (TW)

(73) Assignee: Garmin Switzerland GmbH

( * ) Notice: Subject to any disclaimer, the term of this patent is extended or adjusted under 35 U.S.C. 154(b) by 98 days.

(21) Appl. No.: 16/409,535

(22) Filed: May 10, 2019

(65) Prior Publication Data

US 2019/0379122 A1 Dec. 12, 2019

Related U.S. Application Data

(60) Provisional application No. 62/683,979, filed on Jun. 12, 2018.

(51) Int. Cl.
*H01Q 7/00* (2006.01)
*H01Q 1/24* (2006.01)
(Continued)

(52) U.S. Cl.
CPC .............. *H01Q 1/273* (2013.01); *H01Q 1/242* (2013.01); *H01Q 5/335* (2015.01); *H01Q 7/00* (2013.01);
(Continued)

(58) Field of Classification Search
CPC ........ H01Q 1/242; H01Q 1/243; H01Q 1/273; H01Q 9/04; H01Q 9/0421; H01Q 9/0428;
(Continued)

(56) References Cited

U.S. PATENT DOCUMENTS 8,988,296 B2  3/2015  Koskiniemi et al.
9,509,054 B2  11/2016  Koskiniemi et al.
(Continued)

FOREIGN PATENT DOCUMENTS

CN  107706548 A  2/2018
KR  1020180050151 A  5/2018

OTHER PUBLICATIONS

PCT Patent Application PCT/US2019/036231 International Search Report and Written Opinion dated Oct. 14, 2019.
(Continued)

*Primary Examiner* — Thai Pham
(74) *Attorney, Agent, or Firm* — Samuel M. Korte; Max M. Ali

(57) ABSTRACT

A wrist-worn electronic device configured to transmit and receive wireless signals in two frequency bands comprises a bezel loop antenna, first and second signal processing elements, a diplexer, and a tuning element. The bezel loop antenna has a first impedance and is configured to wirelessly receive first and second electronic signals simultaneously. The first and second signal processing elements process the first electronic signal having a frequency in a first frequency band and the second electronic signal having a frequency in a second frequency band. The diplexer is configured to receive the first and second electronic signals and output the first electronic signal to the first signal processing element and the second electronic signal to the second signal processing element. The tuning element has a second impedance causing the bezel loop antenna to wirelessly receive electronic signals in the first frequency band and electronic signals in the second frequency band.

20 Claims, 13 Drawing Sheets

(51) Int. Cl.
*H01Q 1/27* (2006.01)
*H05K 5/00* (2006.01)
*H05K 1/18* (2006.01)
*H01Q 5/335* (2015.01)
*H01Q 9/04* (2006.01)

(52) U.S. Cl.
CPC ............. *H05K 1/18* (2013.01); *H05K 5/0086* (2013.01); *H01Q 9/04* (2013.01); *H05K 2201/10098* (2013.01)

(58) Field of Classification Search
CPC ............ H01Q 7/00; H01Q 1/42; H01Q 5/328; H01Q 5/335; H01Q 5/50; H01Q 1/24
See application file for complete search history.

(56) References Cited

U.S. PATENT DOCUMENTS

| | | | | |
|---|---|---|---|---|
| 10,271,299 | B1* | 4/2019 | Sayem | H01Q 13/10 |
| 10,276,925 | B2* | 4/2019 | Han | G04G 21/025 |
| 2013/0169494 | A1* | 7/2013 | Hung | H01Q 21/24 |
| | | | | 343/756 |
| 2014/0225786 | A1* | 8/2014 | Lyons | G04G 21/04 |
| | | | | 343/702 |
| 2014/0266920 | A1* | 9/2014 | Tran | H01Q 7/00 |
| | | | | 343/702 |
| 2016/0099497 | A1* | 4/2016 | Lee | H01Q 1/273 |
| | | | | 343/702 |
| 2016/0344439 | A1 | 11/2016 | Seol et al. | |
| 2016/0352014 | A1* | 12/2016 | Chen | H01Q 5/328 |
| 2017/0040701 | A1 | 2/2017 | Hanabusa | |
| 2017/0214422 | A1 | 7/2017 | Na et al. | |
| 2019/0379105 | A1 | 12/2019 | Sayem et al. | |

OTHER PUBLICATIONS

ElectronicsNotes, "Antenna RF Diplexer," https://www.electronics-notes.com/articles/antennas-propagation/antenna-diplexer/what-is-antenna-diplexer.php, printed Oct. 2, 2019, published before May 10, 2019.

Wikipedia, "Diplexer," https://en.wikipedia.org/wiki/Diplexer/, printed Oct. 2, 2019, published before May 10, 2019.

Microwaves101.com, "Diplexers," https://www.microwaves101.com/encyclopedias/diplexers/, printed Oct. 2, 2019, published before May 10, 2019.

PCT Patent Application PCT/US2019/036235 International Search Report and Written Opinion, dated Oct. 1, 2019.

* cited by examiner

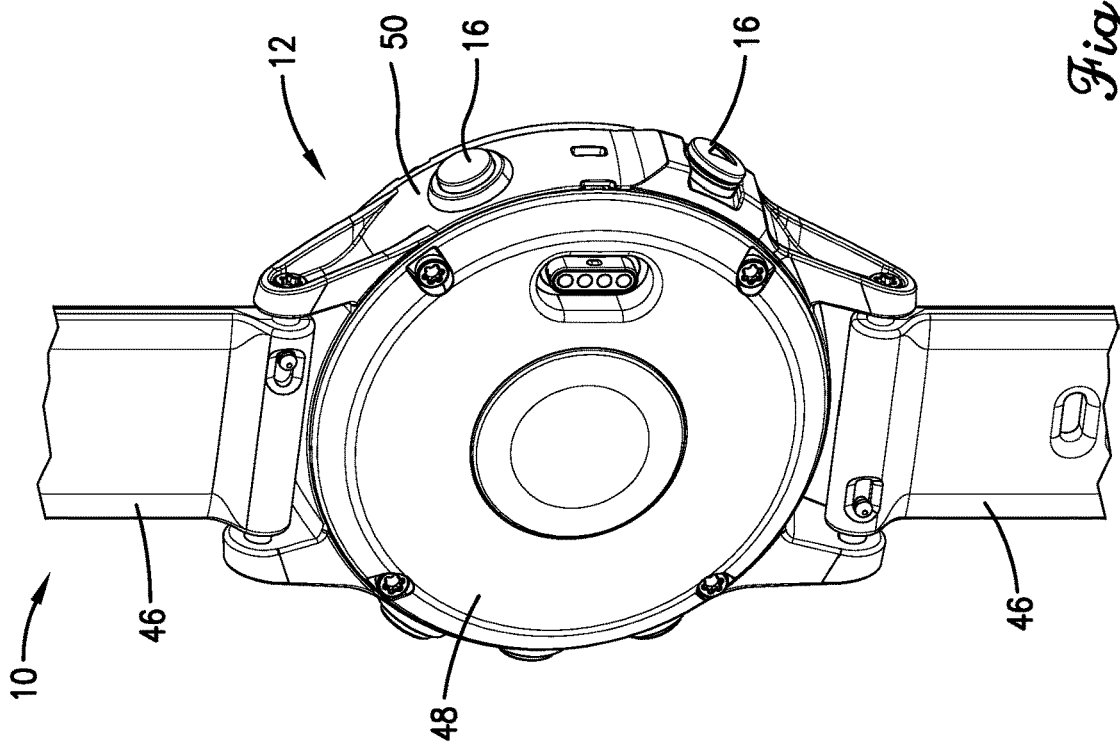
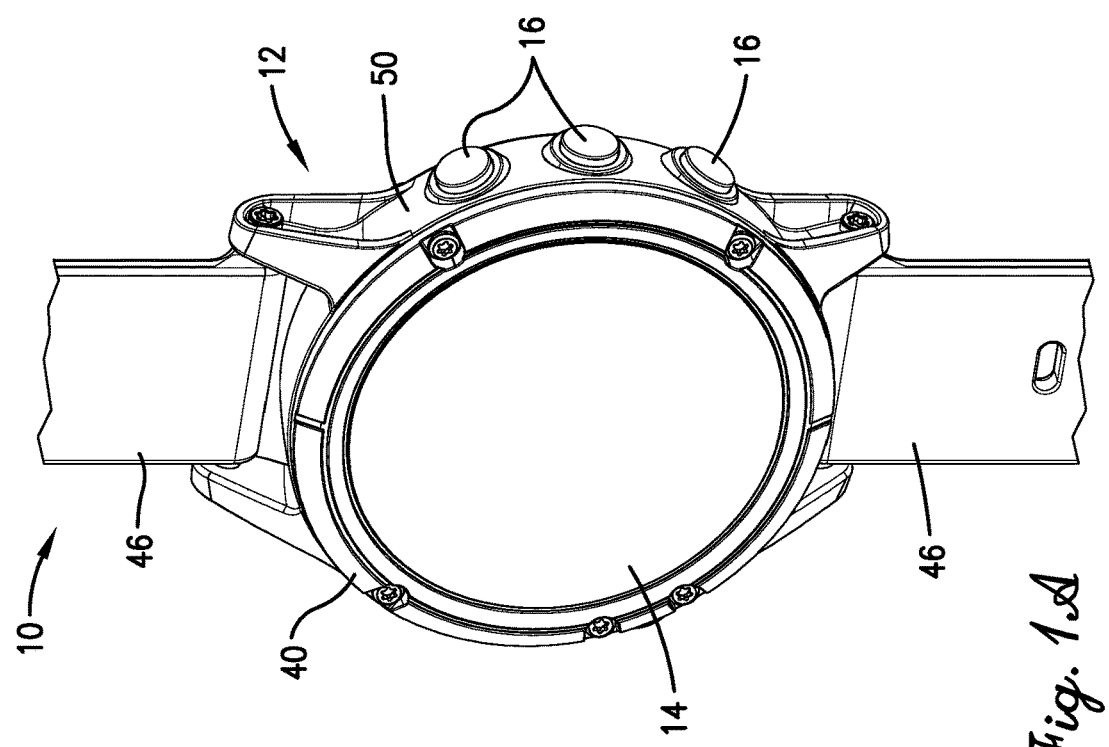

WRIST-WORN ELECTRONIC DEVICE WITH HOUSING-BASED LOOP ANTENNA

RELATED APPLICATIONS

The present application claims the priority benefit under 35 U.S.C. § 119(e) of U.S. Provisional Application Ser. No. 62/683,979, filed Jun. 12, 2018, and entitled "Wrist-Worn Device with Loop Antenna," which is herein incorporated by reference in its entirety.

BACKGROUND

Wrist-worn electronic devices often include functionality that may be used to track wearers' current location, distances traveled, velocities, and other performance metrics or data. This functionality may be provided by receiving positional information from a satellite-based positioning system including the global navigation satellite system (GNSS). In addition, such devices may communicate wirelessly with other electronic devices, systems, or networks to monitor a user's activities, running or biking performance, upload and download data, receive messages and information, and so forth. The communication protocols utilized to transmit and receive information may include Bluetooth, Wi-Fi, or cellular signaling protocols. Such devices may also include one or more antennas that are utilized to receive signals from GNSS satellites and wirelessly communicate with other electronic devices.

SUMMARY

Embodiments of the present technology provide a wrist-worn electronic device with an improved antenna configuration which allows the device to transmit and receive wireless signals in two frequency bands. The electronic device broadly comprises a housing, a bezel, a printed circuit board, a first frequency band element, a second frequency band element, a diplexer, a first electrically conductive element, a second electrically conductive element, and an antenna. The housing includes a bottom wall configured to contact a wearer's wrist, and a side wall with a lower edge coupled to the bottom wall. The bezel, formed from electrically conductive material, has a circular shape and is coupled to an upper edge of the side wall. The printed circuit board retains an electrically conductive first signal terminal and an electrically conductive ground terminal. The first frequency band element is retained on the printed circuit board and configured to process a first electronic signal including a frequency in a first frequency band. The second frequency band element is retained on the printed circuit board and configured to process a second electronic signal including a frequency in a second frequency band. The diplexer is retained on the printed circuit board and configured to multiplex the first electronic signal and the second electronic signal into a third electronic signal. The first electrically conductive element is electrically connected to the first signal terminal and a first contact point on the bezel. The second electrically conductive element is electrically connected to the ground terminal and a second contact point on the bezel. The antenna is formed from the first electrically conductive element, a first portion of the bezel between the first contact point and the second contact point, and the second electrically conductive element. The antenna is configured to transmit and/or receive a first wireless signal and a second wireless signal simultaneously, and convert and multiplex the first wireless signal and the second wireless signal into the third electronic signal.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present technology will be apparent from the following detailed description of the embodiments and the accompanying drawing figures.

BRIEF DESCRIPTION OF THE DRAWING FIGURES

Embodiments of the present technology are described in detail below with reference to the attached drawing figures, wherein:

FIG. 1A is a front perspective view of a wrist-worn electronic device constructed in accordance with embodiments of the present technology, featuring a wrist band coupled to a housing which incorporates an improved antenna configuration;

FIG. 1B is a rear perspective view of the wrist-worn electronic device;

Figure 2:
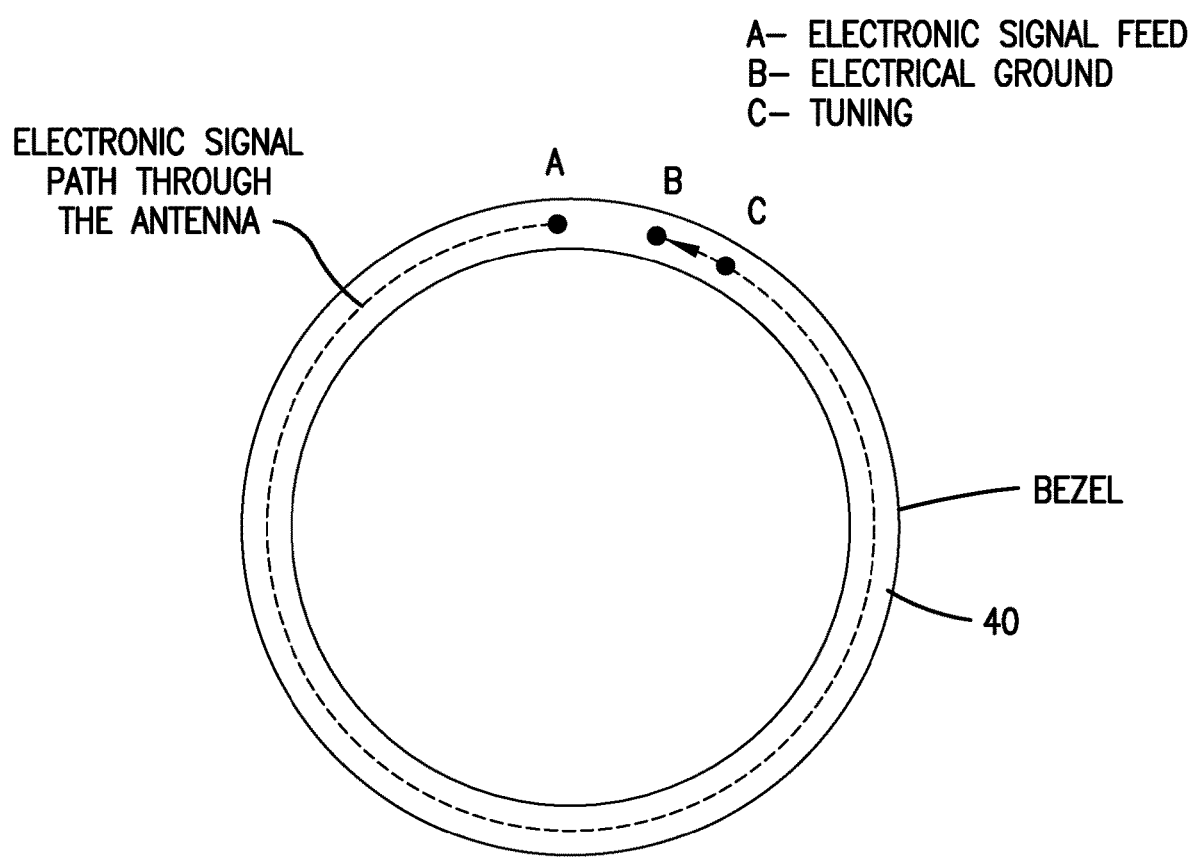
FIG. 2 is a schematic view of the bezel of the first embodiment of the wrist-worn electronic device illustrating a plurality of contact points and an electronic signal path.
Figure 3:
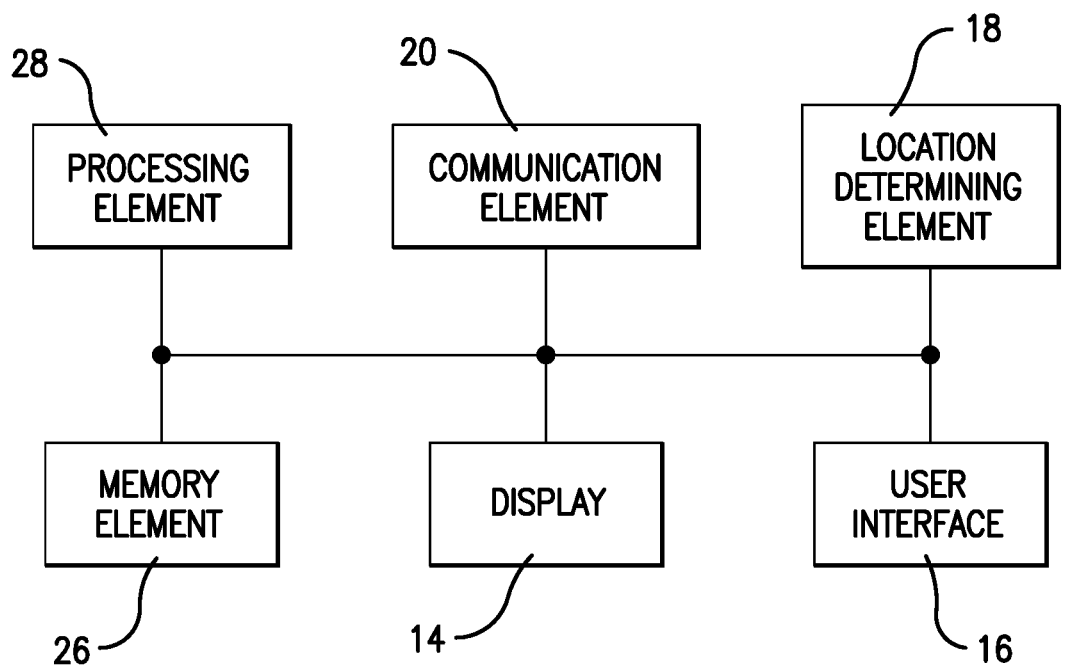
FIG. 3 is a schematic block diagram of various electronic components of the wrist-worn electronic device.
Figure 4:
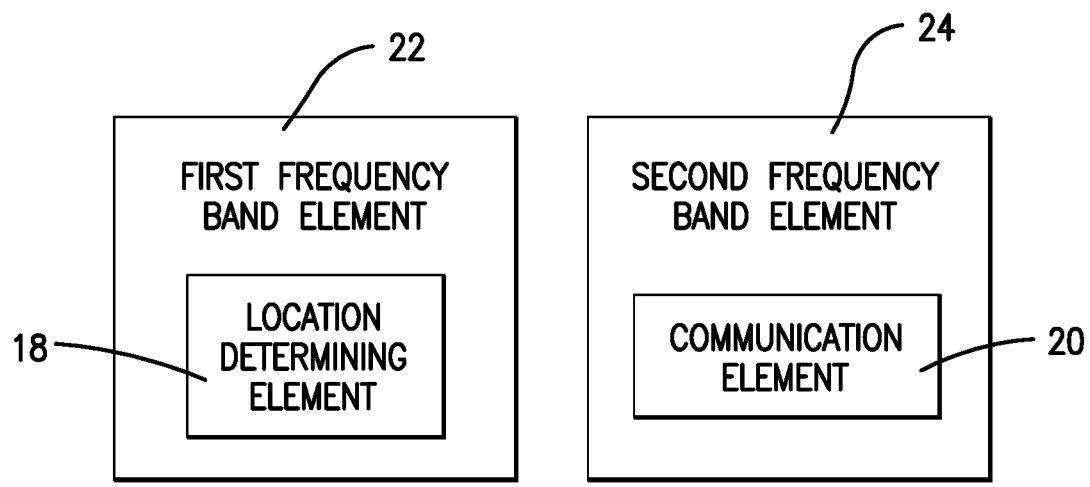
FIG. 4 is a schematic block diagram of a first frequency band element and a second frequency band element of the wrist-worn electronic device.

The drawing figures do not limit the present technology to the specific embodiments disclosed and described herein. While the drawings do not necessarily provide exact dimensions or tolerances for the illustrated components or structures, the drawings are to scale as examples of certain embodiments with respect to the relationships between the components of the structures illustrated in the drawings.

DETAILED DESCRIPTION

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the present technology. The following detailed description is, therefore, not to be taken in a limiting sense. The scope of the present technology is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Embodiments of the present technology relate to an electronic device that can be worn on a user's wrist and that communicates wirelessly with other devices, systems, and networks. The electronic device may be a fitness watch, a wrist-worn smart phone, a wrist-worn navigation device, or other wearable multi-function electronic devices that include a housing and a wrist band, strap, or other attachment mechanism. Although the electronic device is typically worn on a wrist, it may also be worn on other parts of a user's body such as the forearm or the upper arm. The electronic device may be used to monitor the user's current location, distance traveled, velocity, and other performance metrics by receiving location signals from a satellite-based positioning system including the global navigation satellite system (GNSS). The electronic device may be electronically paired with other devices such as a heart rate monitor worn around the user's chest, a foot pod attached to the user's shoe for measuring jogging or running cadence and distance, a bike speed and cadence sensor attached to a crank arm and wheel hub of the user's bicycle for tracking biking performance, and so forth. Furthermore, the electronic device may be able to communicate with smartphones, tablets, laptop or desktop computers, Wi-Fi routers, cell towers, and the like to allow the user to upload activity data, download apps, download or stream music, receive text messages, emails, and weather alerts, and so on. Thus, the electronic device may utilize or process signals with GNSS protocols, Bluetooth™, Wi-Fi, or cellular protocols, and so forth.

Typically, multiple communication protocols require multiple antennas within the housing of the device to transmit and receive wireless signals. However, positioning of the antennas within the confines of the housing such that the wireless signal from one antenna does not interfere with the wireless signals of the other antennas can be challenging.

The present technology relates to a wrist-worn electronic device with an improved antenna configuration that utilizes a bezel on the housing to form at least a portion of an antenna configured to transmit and receive wireless signals in two frequency bands. The electronic device also comprises a printed circuit board, a first frequency band element, a second frequency band element, a diplexer, a first conductive element, a second conductive element, and a radiator. The first and second frequency band elements are retained on the printed circuit board. The first frequency band element processes a first electronic signal including a frequency in a first frequency band, while the second frequency band element processes a second electronic signal including a frequency in a second frequency band. The diplexer is also retained on the printed circuit board and configured to multiplex the first electronic signal and the second electronic signal into a multiplexed third electronic signal. The bezel has a circular shape and is coupled to an upper edge of a housing side wall. It is to be understood that the bezel may be coupled to the side wall by a bonded connection, seal (e.g., mechanical, water, etc.), or any combination thereof. The antenna is configured to transmit and/or receive a first wireless signal and a second wireless signal simultaneously, and convert and multiplex the first wireless signal and the second wireless signal into the multiplexed third electronic signal.

In a first embodiment, the antenna is formed from a portion of the bezel, the first conductive element, and the second conductive element. The first and second conductive elements each electrically connect from a point on the printed circuit board to a point on the bezel. The third electronic signal, which includes data from the first electronic signal and the second electronic signal, is directly coupled to the antenna so that the signal feeds through the first conductive element and returns to electrical ground through the second conductive element.

In a second embodiment, the antenna is formed from the radiator and the bezel, and the multiplexed third electronic signal is capacitively coupled to the antenna through the radiator, such that the signal both feeds and returns to electrical ground through the radiator. The radiator may be positioned along the side wall below the bezel and is capacitively coupled to the bezel.

Embodiments of the technology will now be described in more detail with reference to the drawing figures. Referring initially to FIGS. 1-12, a first embodiment of a wrist-worn electronic device 10 is illustrated. The electronic device 10 broadly comprises a housing 12, a display 14, a user interface 16, a location determining element 18, a communication element 20, a first frequency band element 22, a second frequency band element 24, a memory element 26, a processing element 28, a printed circuit board 30, a plurality of electrically conductive elements 32, a matching element 34, a tuning element 36, a diplexer 38, a bezel 40, an antenna 42, and a tuning stub 44. The electronic device 10 may also include a wrist band 46, a strap, or other attachment mechanisms.

The housing 12, as shown in FIGS. 1A, 1B, 5, and 6, generally houses or retains other components of the electronic device 10 and may include or be attached to the wrist band 46. The housing 12 may include a bottom wall 48, at least one side wall 50, and an internal cavity 52. The bottom wall 48 includes a lower, outer surface that contacts the user's wrist while the user is wearing the electronic device 10. The side wall 50 couples to the bottom wall 48 at a lower edge of the side wall 50. In exemplary embodiments that are shown in the figures, the housing 12 includes a single side wall 50, with inner and outer surfaces, that has a circular or ring shape which generally forms a hollow cylinder. In other embodiments, the side wall 50 may have an oval or elliptical shape. In still other embodiments, the housing 12 may include a plurality of side walls 50 which form one of a plurality of geometric or polygonal shapes, such as triangular, square or rectangular, hexagonal, octagonal, and so forth.

The display 14, as shown in FIGS. 1A, 3, 5, and 6, generally presents the information mentioned above, such as time of day, current location, and the like. The display 14 may be implemented in one of the following technologies: light-emitting diode (LED), organic LED (OLED), Light Emitting Polymer (LEP) or Polymer LED (PLED), liquid crystal display (LCD), thin film transistor (TFT) LCD, LED side-lit or back-lit LCD, or the like, or combinations thereof. In exemplary embodiments that are shown in the figures, the display 14 has a round or circular shape. In general, the display 14 may possess a shape that corresponds to the shape formed by the side walls 50 of the housing 12. The outer edges or perimeter of the display 14 may couple to the side walls 50 using a bonding material.

The user interface 16 generally allows the user to directly interact with the electronic device 10 and may include pushbuttons, rotating knobs, or the like. In exemplary embodiments of FIGS. 1A-3, 5, and 6, the housing 12 may include one or more pushbuttons located in the through holes of the side wall 50 that function as at least a portion of the user interface 16. In various embodiments, the display 14 may include a touch screen occupying the entire display 14, or a portion thereof, so that the display 14 functions as at least a portion of the user interface 16. The touch screen may allow the user to interact with the electronic device 10 by physically touching, swiping, or gesturing on areas of the display 14.

The location determining element 18 generally determines a current geolocation of the electronic device 10 and may receive and process radio frequency (RF) signals from a multi-constellation global navigation satellite system (GNSS) such as the global positioning system (GPS) utilized in the United States, the GLONASS system utilized in Russia, the Galileo system utilized in Europe, or the like. The location determining element 18 may include satellite navigation receivers, processors, controllers, other computing devices, or combinations thereof, and memory. The location determining element 18 may process a radio frequency (RF) signal, referred to herein as an "location electronic signal", from one or more satellites that includes data from which geographic information such as the current geolocation is derived. The location electronic signal may have a carrier frequency in a frequency band, including the L1 band of the GPS constellation, centered at approximately 1575 megahertz (MHz). The location electronic signal is received from the antenna 42, discussed in more detail below. The current geolocation may include coordinates, such as the latitude and longitude, of the current location of the electronic device 10. The location determining element 18 may communicate the current geolocation to the processing element 28, the memory element 26, or both.

Although embodiments of the location determining element 18 may include a satellite navigation receiver, it will be appreciated that other location-determining technology may be used. For example, cellular towers or any customized transmitting radio frequency towers can be used instead of satellites may be used to determine the location of the electronic device 10 by receiving data from at least three transmitting locations and then performing basic triangulation calculations to determine the relative position of the device with respect to the transmitting locations. With such a configuration, any standard geometric triangulation algorithm can be used to determine the location of the electronic device. The location determining element 18 may also include or be coupled with a pedometer, accelerometer, compass, or other dead-reckoning components which allow it to determine the location of the device 10. The location determining element 18 may determine the current geographic location through a communications network, such as by using Assisted GPS (A-GPS), or from another electronic device. The location determining element 18 may even receive location data directly from a user.

The communication element 20 generally allows communication with external systems or devices, other than GPS systems. The communication element 20 may include signal or data transmitting and receiving circuits, such as amplifiers, filters, mixers, oscillators, digital signal processors (DSPs), and the like. Various combinations of these circuits may form a transceiver, which transmits, receives, and processes signals such as the ones listed in the following discussion. The communication element 20 may establish communication wirelessly by utilizing RF signals and/or data that comply with communication standards such as Bluetooth™ Bluetooth™ low energy (BLE), ANT, ANT+, the industrial, scientific, and medical (ISM) band, Institute of Electrical and Electronics Engineers (IEEE) 802.11 standard such as Wi-Fi, or the like, which operate at, or have a carrier frequency in, a frequency band centered at approximately 2.4 gigahertz (GHz). In other embodiments, the communication element 20 may utilize communication standards such as cellular 2G, 3G, or 4G, LTE, 5G, IEEE 802.16 standard such as WiMAX, or combinations thereof.

In various embodiments, the electronic device 10 may be configured to establish communication using a plurality of communication protocols or standards, and the communication element 20 may include a transceiver for each protocol or standard, such as Bluetooth™, Wi-Fi, etc., which the device 10 can communicate. For example, the electronic device 10 may utilize Bluetooth™ to establish communication with exercise-related sensors, such as a foot pod, a bike speed and cadence sensor, or the like, or other electronic devices, such as wireless headphones, a smartphone, a tablet, a laptop, or a desktop computer. The electronic device 10 may utilize Wi-Fi to establish communication with wireless routers or hotspots to access the Internet or other communication networks.

The communication element 20 may transmit and receive, or communicate, a radio frequency communication electronic signal, which the communication element processes to determine data that was received using any of the above-listed protocols. The communication element 20 also generates data included in the communication electronic signal to be transmitted using any of the above-listed protocols.

The first frequency band element 22 includes electronic circuitry configured to process electronic signals that include a frequency in a first frequency band. In exemplary embodiments shown in FIG. 4, the first frequency band element 22 includes the location determining element 18, and the first frequency band includes a range of frequencies centered at approximately 1575 MHz. In alternative embodiments, the first frequency band element 22 may include the communication element 20 only, and thus the first frequency band may include a range of frequencies centered at approximately 2.4 GHz.

The second frequency band element 24 includes electronic circuitry configured to process electronic signals that include a frequency in a second frequency band. In exemplary embodiments shown in FIG. 4, the second frequency band element 24 includes the communication element 20, and the second frequency band includes a range of frequencies centered at approximately 2.4 GHz.

The memory element 26 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, flash memory, thumb drives, universal serial bus (USB) drives, or the like, or combinations thereof. In some embodiments, the memory element 26 may be embedded in, or packaged in the same package as, the processing element 28. The memory element 26 may include, or may constitute, a "computer-readable medium". The memory element 26 may store the instructions, code, code statements, code segments, software, firmware, programs, applications, apps, services, daemons, or the like that are executed by the processing element 28. The memory element 26 may also store data that is received by the processing element 28 or the device in which the processing element 28 is implemented. The processing element 28 may further store data or intermediate results generated during processing, calculations, and/or computations as well as data or final results after processing, calculations, and/or computations. In addition, the memory element 26 may store settings, data, documents, sound files, photographs, movies, images, databases, and the like.

The processing element 28 may comprise one or more processors. The processing element 28 may include electronic hardware components such as microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 28 may generally execute, process, or run instructions, code, code segments, code statements, software, firmware, programs, applications, apps, processes, services, daemons, or the like. The processing element 28 may also include hardware components such as registers, finite-state machines, sequential and combinational logic, and other electronic circuits that can perform the functions necessary for the operation of the current invention. In certain embodiments, the processing element 28 may include multiple computational components and functional blocks that are packaged separately but function as a single unit. The processing element 28 may be in electronic communication with the other electronic components through serial or parallel links that include universal busses, address busses, data busses, control lines, and the like.

The printed circuit board 30, as shown in FIGS. 5, 6, and 8-12, generally provides a substrate for supplying electric power to, and electronic communication between, the electronic components, such as the location determining element 18, the communication element 20, the first frequency band element 22, the second frequency band element 24, the memory element 26, the processing element 28, the matching element 34, the tuning element 36, and the diplexer 38. The printed circuit board 30 may be constructed with a first, or top, surface and an opposing second, or bottom, surface. The printed circuit board 30 may also include multiple electrically conductive layers with a top conductive layer placed on the first surface, a bottom conductive layer placed on the second surface, one or more inner conductive layers positioned between the first and second surfaces, and an insulating layer between each pair of adjacent conductive layers. The insulating layers may be formed from rigidized material that includes various combinations of fiberglass, woven glass, matte glass, cotton paper, phenolic cotton paper, polyester, epoxies, epoxy resins, and the like. The conductive layers may be formed from metals typically including copper, but also including nickel, aluminum, gold, silver, palladium, zinc, tin, lead, and the like. Each conductive layer may include one or more electrically conductive traces. The conductive traces may be utilized to communicate electronic signals or may be electrically connected to electric power or ground. Each conductive layer may additionally or alternatively include one or more signal, power, or ground pads or terminals, full or partial electric power planes, or full or partial electric ground planes. In addition, the printed circuit board 30 may include plated through hole vias, blind vias, buried vias, and the like. The electronic components may be implemented in packages which are mounted, or retained, on the top surface, the bottom surface, or both surfaces. The electronic components may communicate with one another through electronic signal traces.

The printed circuit board 30 also includes a plurality of electrically conductive signal terminals 54 that are typically retained on either the top surface or the bottom surface. Each signal terminal 54 is electrically connected to one signal trace. In exemplary embodiments shown in the figures, the printed circuit board 30 includes a first signal terminal 54A that electrically connects to a signal trace carrying or communicating an RF electronic signal such as the location electronic signal and/or the communication electronic signal. The printed circuit board 30 includes a second signal terminal 54B electrically connected to the tuning element 36.

Furthermore, the printed circuit board 30 also includes at least one electrically conductive ground terminal 56 typically retained on the top surface, the bottom surface, or along the plated edge. The ground terminal 56 is electrically connected to one ground trace or a ground plane. Additionally, the printed circuit board 30 may include power terminals that are electrically connected to a power trace or power plane.

Figure 5:
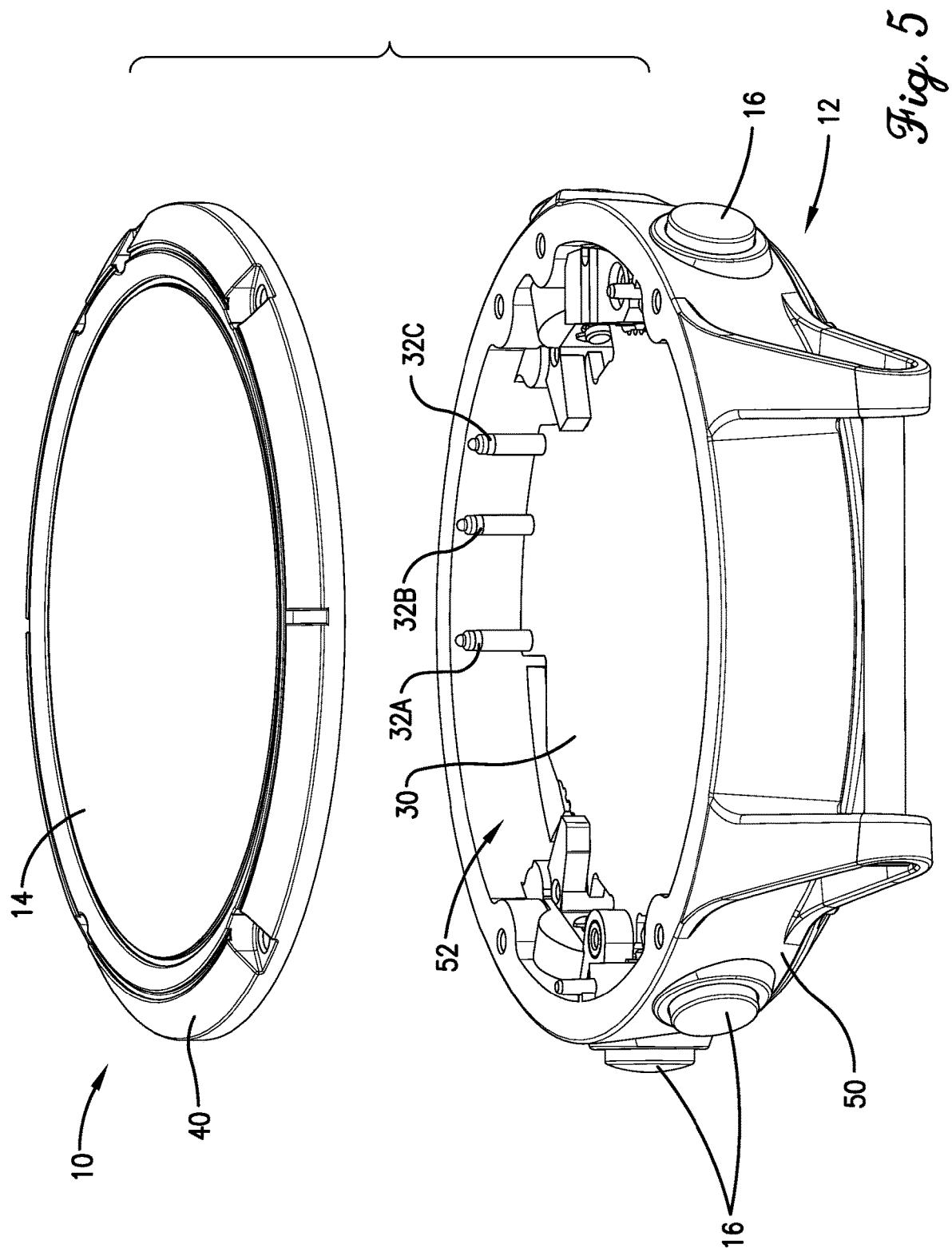
FIG. 5 is a top perspective view of a first embodiment of the wrist-worn electronic device with a bezel and a display removed from the housing to reveal a plurality of conductive elements coupled to a printed circuit board.
Figure 6:
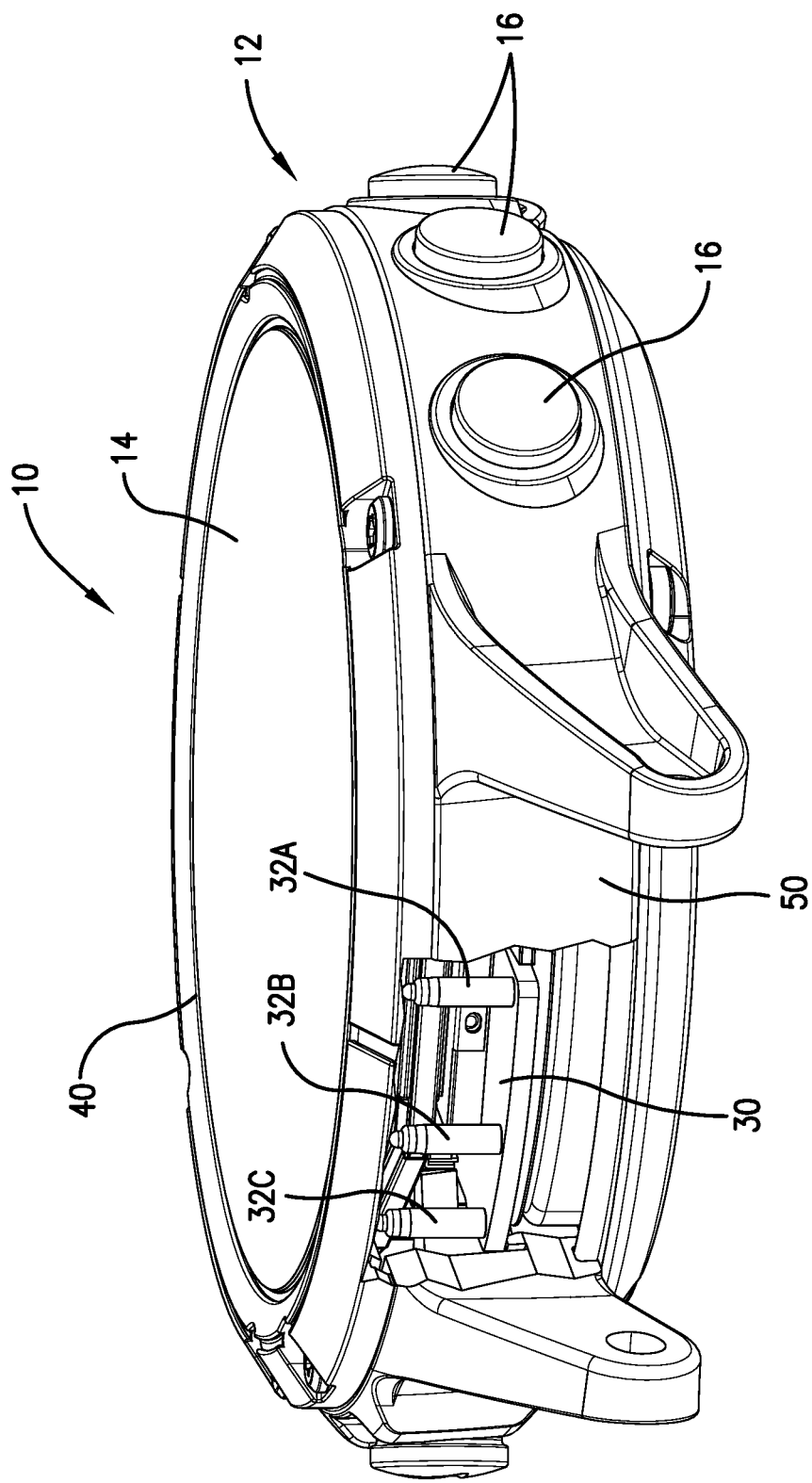
FIG. 6 is a perspective view of the first embodiment of the wrist-worn electronic device with a portion of a side wall of the housing cut away to reveal the conductive elements.

Each conductive element 32, as shown primarily in FIGS. 5 and 6, may be formed from electrically conductive materials, such as metals and/or metal alloys. In exemplary embodiments, each conductive element 32 may include a pogo pin. Additionally or alternatively, the conductive elements 32 may include wires, jumpers, posts, flexible conductors, clamp and/or spring structures, or the like, or combinations thereof. In embodiments shown in the figures, the electronic device 10 includes a first conductive element 32A, a second conductive element 32B, and a third conductive element 32C. The first conductive element 32A is retained on the printed circuit board 30 and electrically connects to the matching element 34 and to a first contact point on the bezel, labeled "A", as shown in FIG. 2. The second conductive element 32B is retained on the printed circuit board 30 and electrically connects to electrical ground and to a second contact point on the bezel, labeled "B". The third conductive element 32C is retained on the printed circuit board 30 and electrically connects to the tuning element 36 and to a third point on the bezel, labeled "C".

The matching element 34 generally provides impedance matching to the antenna 42 in order to transfer maximum power from the first frequency band element 22, the second frequency band element 24, or the diplexer 38 to the antenna 42. The matching element 34 may include impedance, reactive, and/or resistive passive components forming LC circuits, filters, and the like, or combinations thereof. In various embodiments, the impedance may include 50 ohms. In some embodiments, one or more components may be electrically connected to electric ground. The matching element 34 has a first port in electronic communication with the first frequency band element 22, the second frequency band element 24, or the diplexer 38 and a second port in electronic communication with the antenna 42 through the first signal terminal 54A and the first conductive element 32A. The configuration and the values of the components used in the matching element 34 are set to provide impedance matching for the antenna 42 for both the first frequency band and the second frequency band. In normal practice, the configuration and values of components are set once and not changed. In various embodiments, two-port parameters including S11, S12, S21, and S22 may be considered and/or calculated when determining the configuration and values of components of the matching element 34.

The tuning element 36 generally provides additional impedance matching to match the first frequency band element 22, the second frequency band element 24, or the diplexer 38 to the complex impedance at the input to the antenna 42. The tuning element 36 may include impedance, reactive, and/or resistive passive components as well as L networks, T networks, Pi networks, combinations thereof and so forth. In some embodiments, one or more components may be electrically connected to electric ground. The tuning element 36 may be in electronic communication with the antenna 42 through the second signal terminal 54B and the third conductive element 32. The configuration and the values of the components used in the tuning element 36 are set to provide impedance matching for the antenna 42 for both the first frequency band and the second frequency band. In normal practice, the configuration and values are set once and not changed. In some embodiments, the tuning element 36 and the matching element 34 work in combination to provide impedance matching for the antenna and other components.

The diplexer 38 generally provides multiplexing of a first electronic signal and a second electronic signal into a third electronic signal. Typically, the first electronic signal includes a frequency and data in a first frequency band and the second electronic signal includes a frequency and data in a second frequency band different from the first frequency band. The multiplexed third electronic signal includes frequency and data components from each of the first electronic signal and the second electronic signal. In addition, the diplexer demultiplexes (or retrieves, or separates) the first electronic signal and the second electronic signal from the third electronic signal.

The diplexer 38 may be formed from electronic components, typically passive, that provide frequency filtering and isolation between the first and second electronic signals. The diplexer 38 includes a first port that communicates the first electronic signal with the first frequency band element 22, a second port that communicates the second electronic signal with the second frequency band component, and a third port that communicates the third electronic signal with the matching element 34.

The bezel 40, as seen in FIGS. 1A and 5-12, may be positioned on the upper surface of housing 12 and may generally cover the perimeter edges of the display 14 or encircle the display 14. The bezel 40 may be a ring shaped to conform to the shapes of a circular or oval housing 12 and display 14 such that the bezel 40 may be positioned between the perimeters of the housing 12 and the display 14. The bezel 40 may have an outer perimeter, or outer circumference, that is substantially the same shape as the upper surface of the housing 12 and an inner perimeter, or inner circumference, that is substantially the same shape as the outer perimeter of the display 14. For example, the bezel 40 may have an inner edge with dimensions that are smaller than or approximately equal to the perimeter dimensions of the display 14 and an outer edge with dimensions that are approximately equal to the perimeter dimensions of the upper surface of the housing 12. Thus, the bezel 40 may be circular, square, or rectangular with a central opening through which the display 14 may be viewed, although in the exemplary embodiments shown in the figures, the bezel 40 may have an annular shape.

The bezel 40 may be formed from any material that may integrate an electrically conductive metallic or semi-metallic material and may be positioned on or fixedly attached to an outer surface of an upper wall of a metallic or semi-metallic housing 12. In some embodiments, the bezel 40 may be able to rotate in place, roughly around the center of the upper surface of the housing 12. In other embodiments, the bezel 40 may be firmly attached to the upper surface and may not rotate. In embodiments, the bezel 40 may be integral to the housing 12. For example, the bezel 40 may be a raised or flush portion of the housing 12 with a central opening through which the display 14 may be viewed.

The antenna 42, as shown in FIGS. 7-12, generally converts wireless RF electromagnetic radiation (a wireless signal) into a corresponding electronic signal and converts an electronic signal into a corresponding wireless signal. The antenna 42 may transmit and receive a first wireless signal including a frequency in a first frequency band and, simultaneously, a second wireless signal including a frequency in a second frequency band. In exemplary embodiments, the antenna 42 receives a location wireless signal, such as a GNSS signal, including a frequency in a frequency band centered at approximately 1575 MHz. At the same time, the antenna 42 transmits and receives a communication wireless signal, such as Bluetooth™ and/or Wi-Fi, including a frequency in a frequency band centered at approximately 2.4 GHz.

In addition, the antenna 42 converts the first wireless signal into a corresponding first electronic signal and vice-versa, and the second wireless signal into a corresponding second electronic signal and vice-versa. Given that the antenna 42 typically transmits and/or receives the first wireless signal and the second wireless signal simultaneously, the antenna 42 converts and multiplexes the two wireless signals into a third electronic signal which includes frequency and data components from each of the first electronic signal and the second electronic signal. In exemplary embodiments, the antenna 42 converts and multiplexes the location wireless signal and the communication wireless signal into the multiplexed third electronic signal which includes frequency and data components from the location electronic signal and the communication electronic signal.

The antenna 42 is typically configured or implemented as a loop antenna. Alternatively, the antenna 42 may be configured or implemented as a slot antenna, a microstrip antenna, a patch antenna, a linear antenna, an inverted F-antenna, an inverted L-antenna, a dipole antenna, or the like. The antenna 42 is formed from the first conductive element 32A, the second conductive element 32B, and, as indicated by the "electronic signal path" in FIG. 2, a portion of the bezel 40 between the contact point A of the first conductive element 32A and the contact point B of the second conductive element 32B and, in embodiments, the tuning stub 44. The longer (counter-clockwise) distance between the contact point A and the contact point B is related to, proportional to, or varies according to, a wavelength, or a portion thereof, of the lower frequency (and longer wavelength) wireless signal—in exemplary embodiments, that is the location wireless signal.

The antenna 42 receives the location wireless signal and the communication wireless signal, either individually or in combination as the third electronic signal, from the printed circuit board 30 through the first signal terminal 54A. The signals then flow through the first conductive element 32A, the portion of the bezel 40 counter-clockwise from the contact point A to the contact point B as indicated in FIG. 2, and the second conductive element 32B. The location wireless signal and the communication wireless signal then return to electric ground of the printed circuit board 30.

The tuning stub 44 generally provides improvement in the performance of receiving and/or transmitting one or more polarized wireless signals by the antenna 42. The tuning stub 44 may have an elongated arcuate shape and is formed from electrically conductive materials such as metals and/or metal alloys. In exemplary embodiments, the tuning stub 44 improves the performance of receiving the right-hand polarization of the GNSS location wireless signal. In some embodiments, the tuning stub 44 may have a length substantially equal to one-quarter of the wavelength of a first wireless signal having a frequency in the first frequency band. Alternatively, the tuning stub 44 may have a length substantially equal to one-quarter of the wavelength of a second wireless signal having a frequency in the second frequency band.

Figure 7:
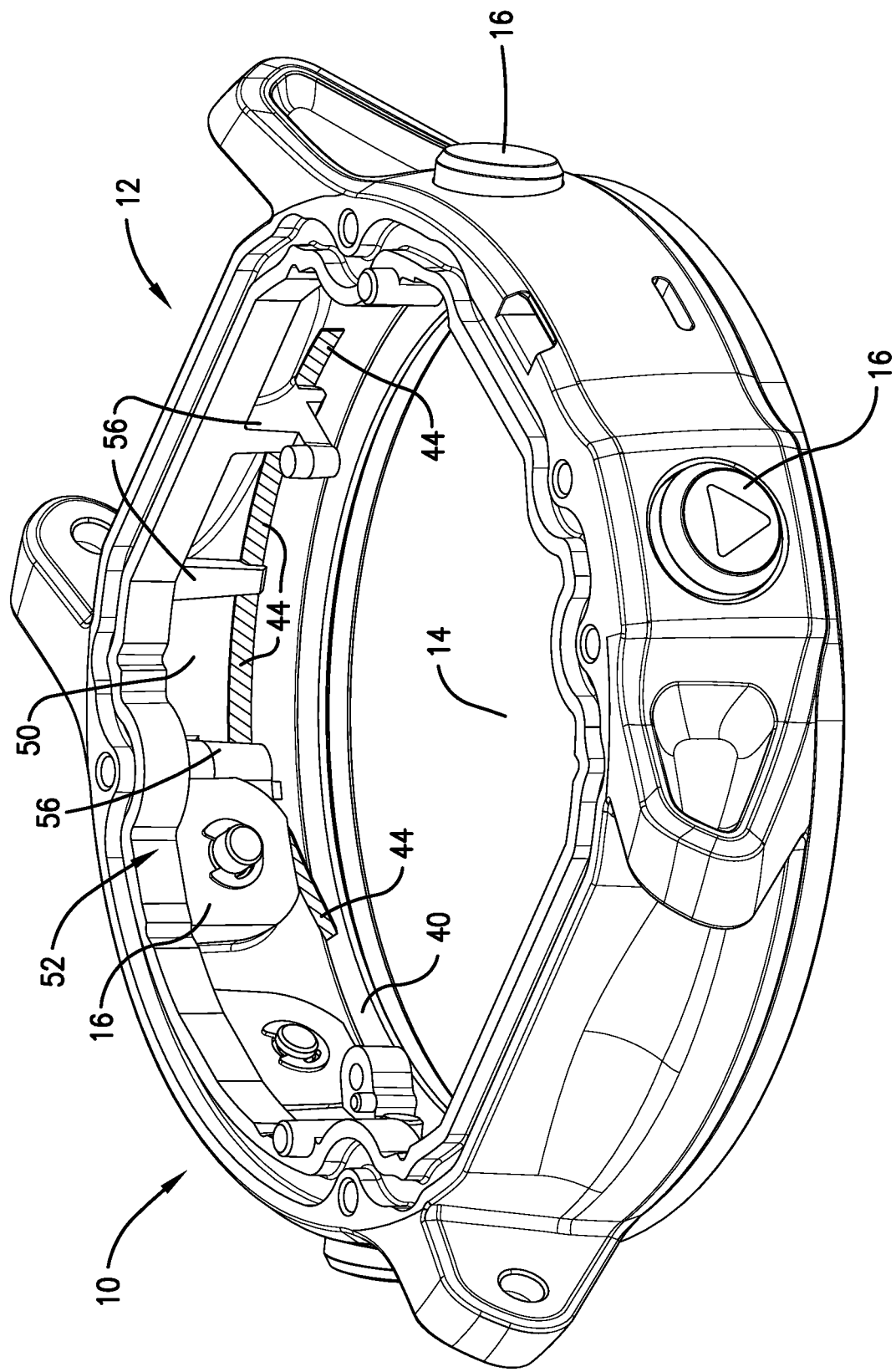
FIG. 7 is an upside down (underside) perspective view of an embodiment of the wrist-worn electronic device with a bottom wall of the housing cut away and the printed circuit board removed to reveal a tuning stub extending down from a bezel of the housing.

As shown in FIG. 7, which depicts the inner cavity 52 of the watch housing 12 by removing the bottom wall 48 and the printed circuit board 30 (not depicted), the tuning stub 44 may contact a lower surface of bezel 40. One or more portions of the tuning stub 44 may be positioned against an inner surface of side wall 50 and be retained by one or more retaining elements 56 securing the tuning stub 44 against side wall 50 such that tuning stub 44 is positioned above and separated from printed circuit board 30 (not depicted) and bottom wall 48. In embodiments, one or more portions of the tuning stub 44 pass under and around a portion of the assembly associated with user interface 16. The tuning stub 44 is electrically connected to the bezel 40 at a point along the antenna signal path between the contact point A and the contact point B. As shown in FIG. 7, the tuning stub 44 may extend downward from bezel 40 in a counter-clockwise fashion (when viewed from a front view through the display 14) in the space between the lower surface of the bezel 40 and the printed circuit board 30.

The electronic device 10 may be implemented in a plurality of configurations. In a first configuration shown in FIG. 8, the electronic device 10 includes the first frequency band element 22 only. The first frequency band element 22 communicates the first electronic signal through the matching element 34 to the antenna 42, which transmits and/or receives the first wireless signal. The antenna 42 also communicates the first electronic signal back to the first frequency band element 22. The matching element 34 and the tuning element 36 match the impedance of the antenna to 50 ohms for the first frequency band. In typical embodiments, the first frequency band element 22 includes the location determining element 18; the first electronic signal is the location electronic signal; and the first wireless signal is the location wireless signal, such as a GNSS signal. In alternative embodiments, the first frequency band element 22 includes the communication element 20; the first electronic signal is the communication electronic signal; and the first wireless signal is the communication wireless signal, such as a Bluetooth™ or Wi-Fi signal.

Figure 9:
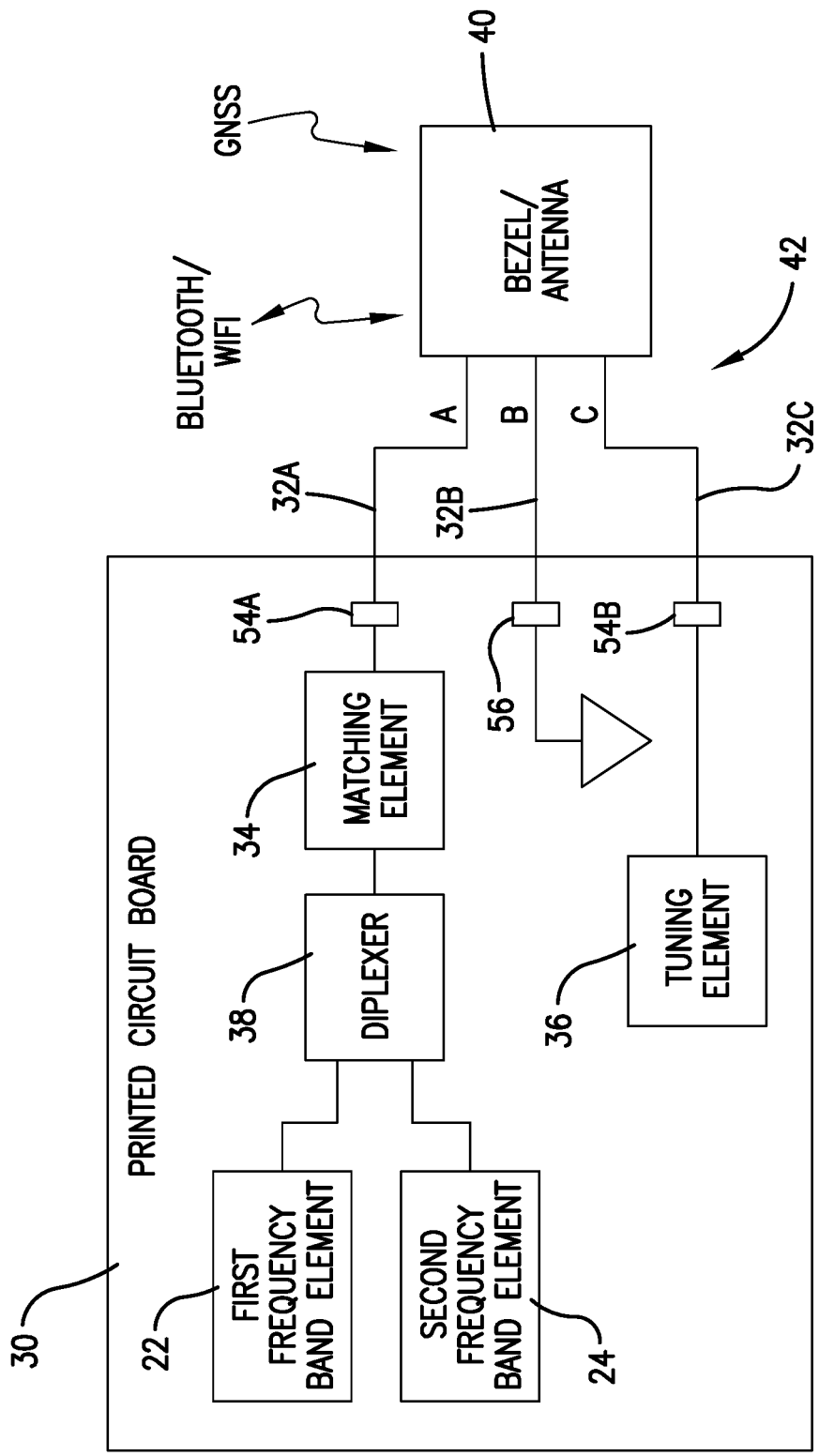
FIG. 9 is a schematic block diagram of a second configuration the first embodiment of the wrist-worn electronic device.

In a second configuration shown in FIG. 9, the electronic device 10 includes the first frequency band element 22 and the second frequency band element 24 which communicate the first electronic signal and the second electronic signal, respectively, to the diplexer. The diplexer communicates the multiplexed third electronic signal to the antenna 42 through the matching element 34. The antenna 42 transmits and receives the first wireless signal and the second wireless signal simultaneously. The antenna 42 also communicates the third electronic signal back to the diplexer 38 which, in turn, communicates the first electronic signal back to the first frequency band element 22 and the second electronic signal back to the second frequency band element 24. The matching element 34 and the tuning element 36 match the impedance of the antenna to 50 ohms for the first frequency band and the second frequency band. In exemplary embodiments, the first frequency band element 22 includes the location determining element 18; the first electronic signal is the location electronic signal; and the first wireless signal is the location wireless signal. The second frequency band element 24 includes the communication element 20; the second electronic signal is the communication electronic signal; and the second wireless signal is the communication wireless signal.

Figure 8:
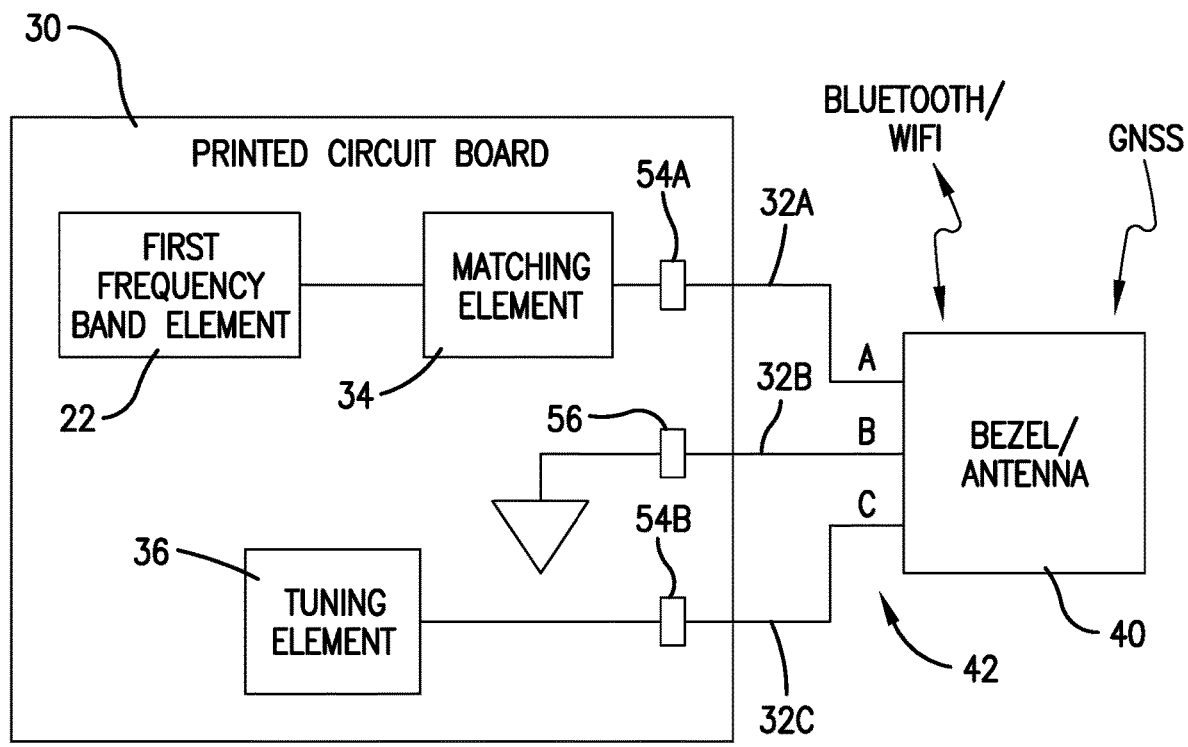
FIG. 8 is a schematic block diagram of a first configuration the first embodiment of the wrist-worn electronic device.
Figure 10:
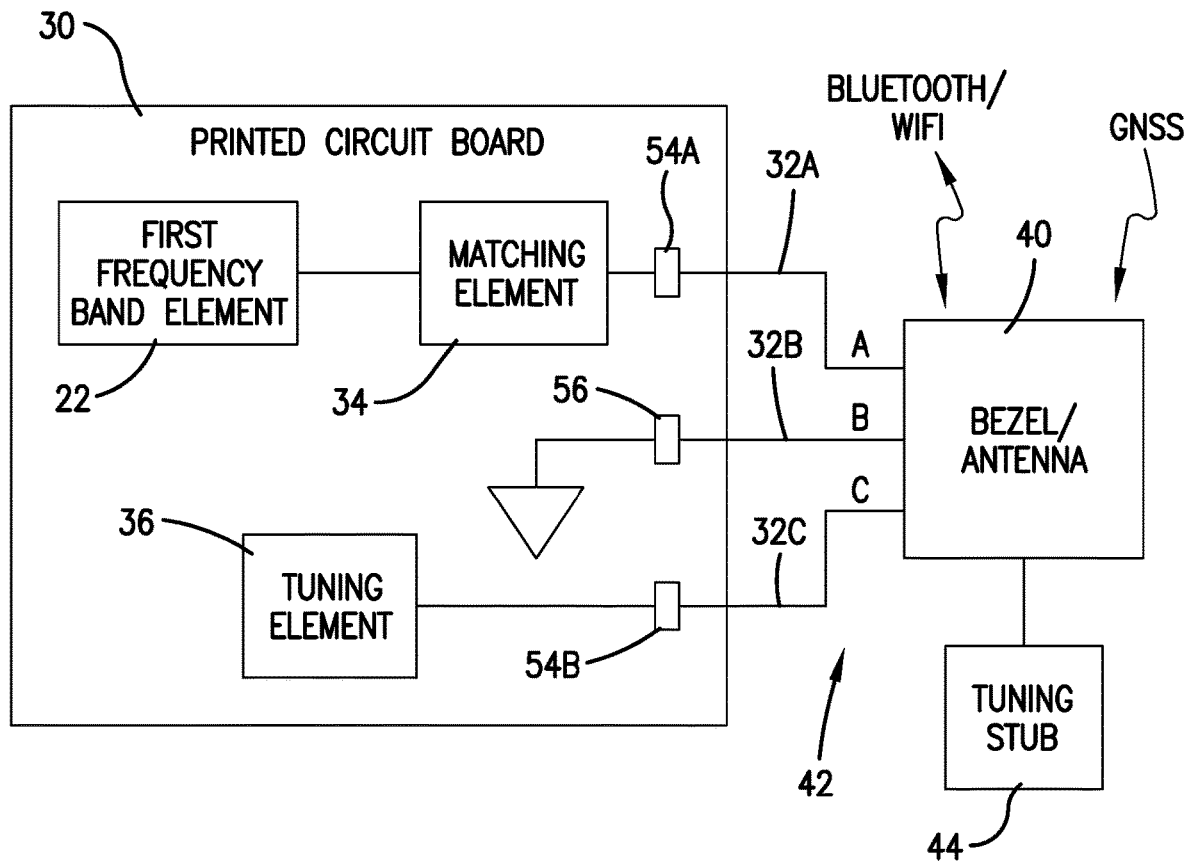
FIG. 10 is a schematic block diagram of a third configuration the first embodiment of the wrist-worn electronic device.

A third configuration of the electronic device 10, shown in FIG. 10, is substantially similar to the first configuration of FIG. 8 in structure and operation, except that the third configuration includes the tuning stub 44 coupled to the antenna 42. Thus, there is an improvement in the performance of receiving the right-hand polarized GNSS location wireless signal (at a first frequency band).

Figure 11:
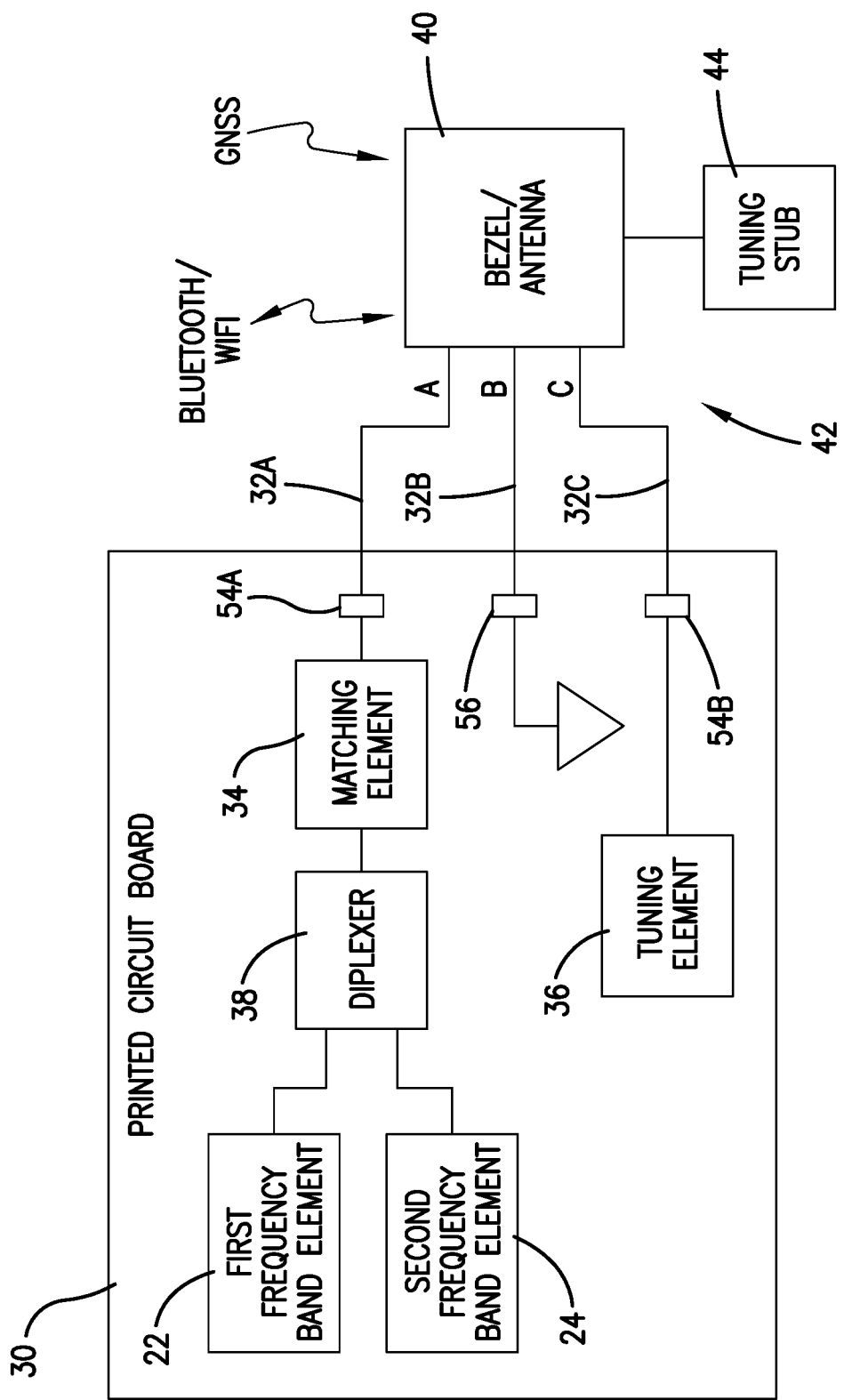
FIG. 11 is a schematic block diagram of a fourth configuration the first embodiment of the wrist-worn electronic device.

A fourth configuration of the electronic device 10, shown in FIG. 11, is substantially similar to the second configuration of FIG. 9 in structure and operation, except that the fourth configuration includes the tuning stub 44 coupled to the antenna 42. Thus, there is an improvement in the performance of receiving the right-hand polarized GNSS location wireless signal.

Figure 12:
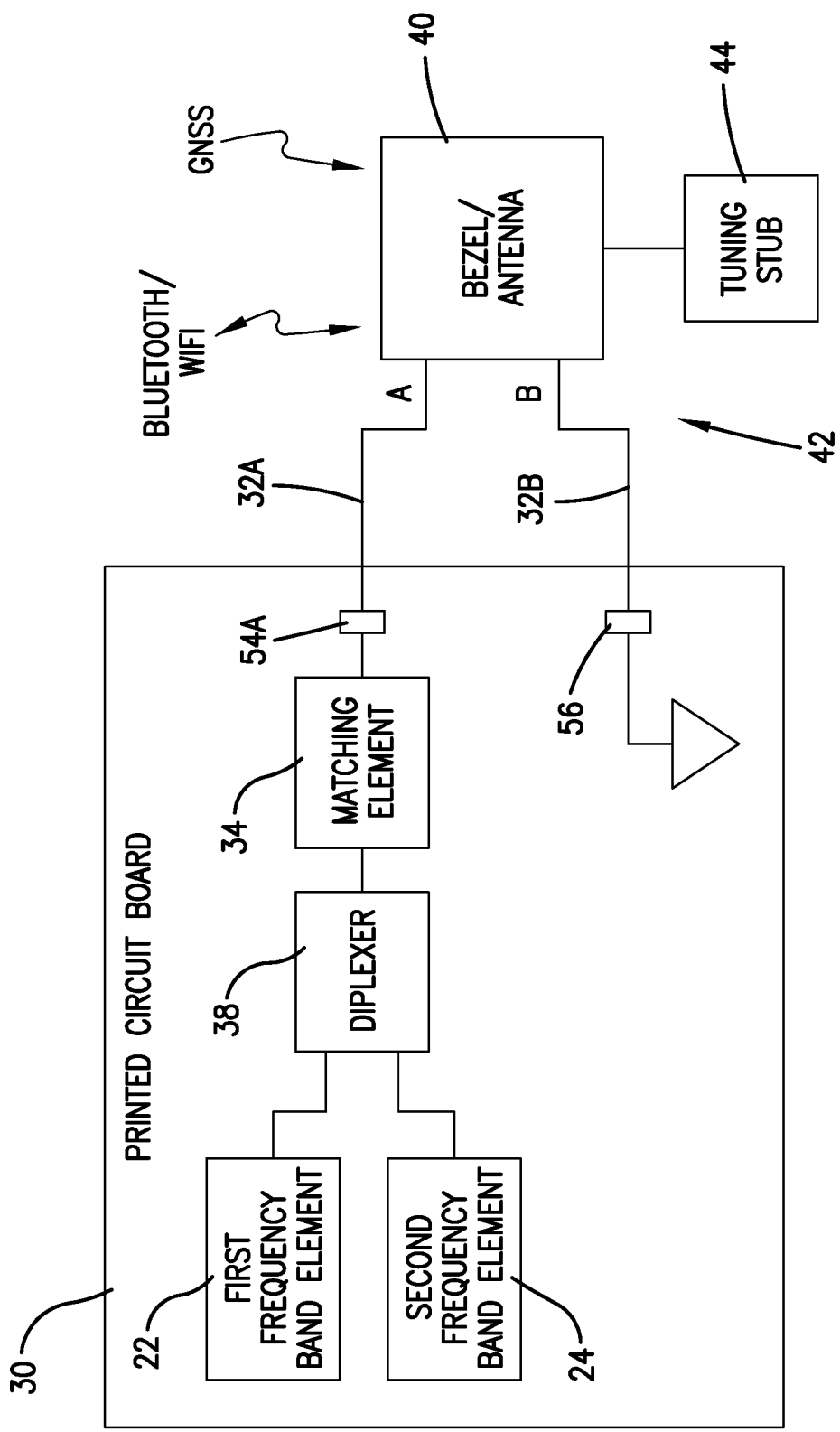
FIG. 12 is a schematic block diagram of a fifth configuration the first embodiment of the wrist-worn electronic device.

A fifth configuration of the electronic device 10, shown in FIG. 12, is substantially similar to the fourth configuration of FIG. 11 in structure and operation, except that the fifth configuration excludes the tuning element 36 retained on the printed circuit board 30.

Figure 13:
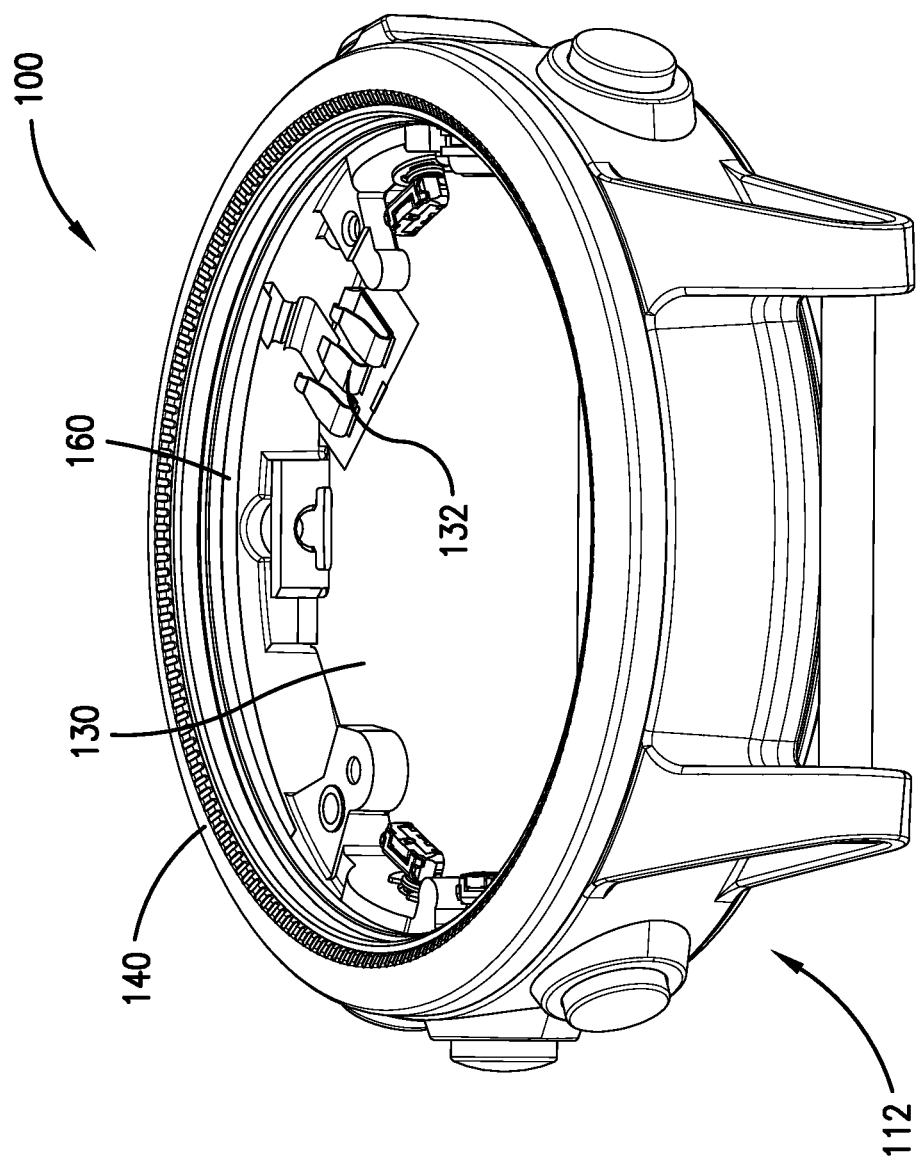
FIG. 13 is a top perspective view of a second embodiment of the wrist-worn electronic device with the display removed from the housing to reveal a radiator capacitively coupled to the bezel.
Figure 15:
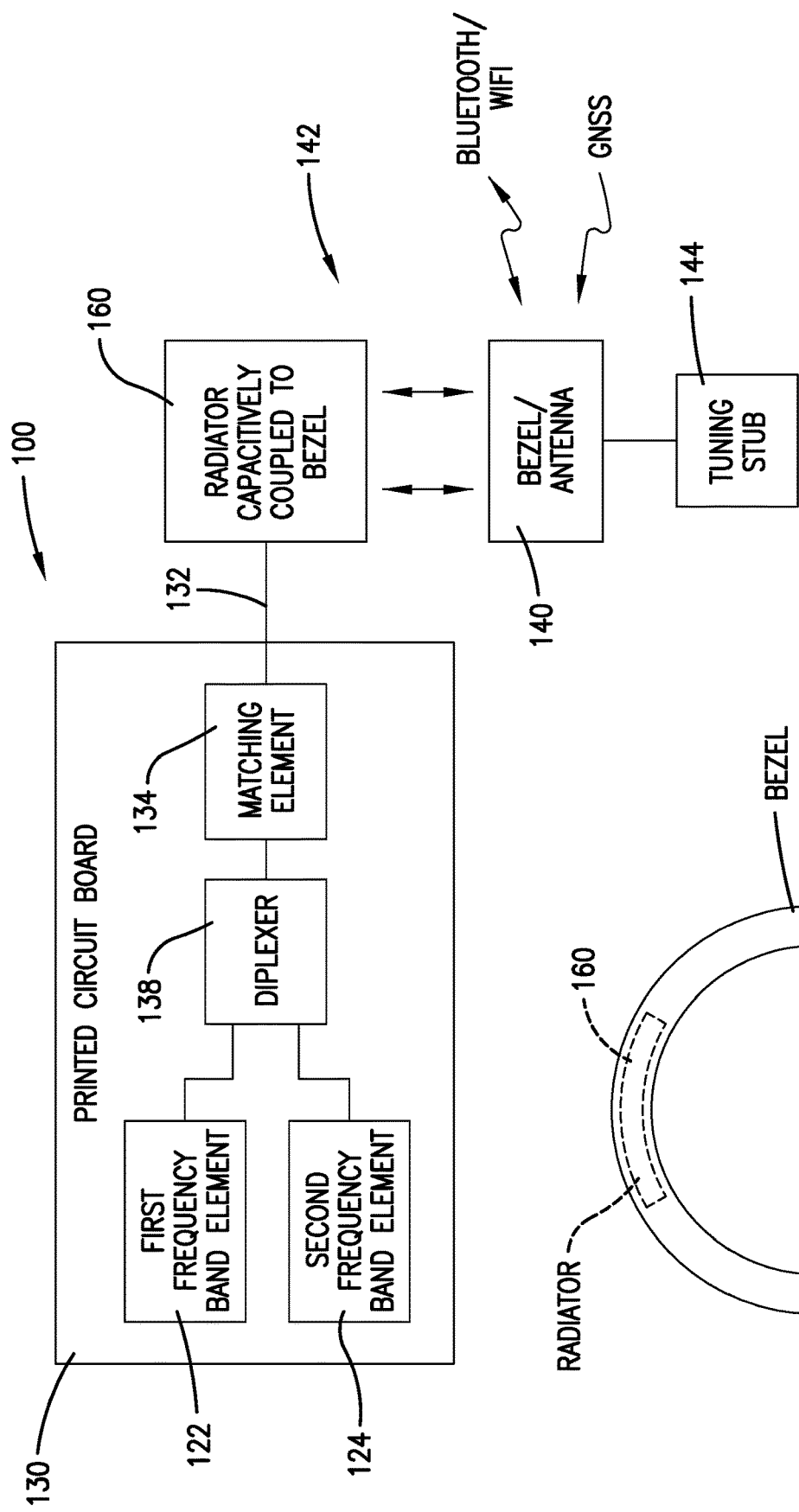
FIG. 15 a schematic block diagram of a first configuration the second embodiment of the wrist-worn electronic device.
Figure 14:
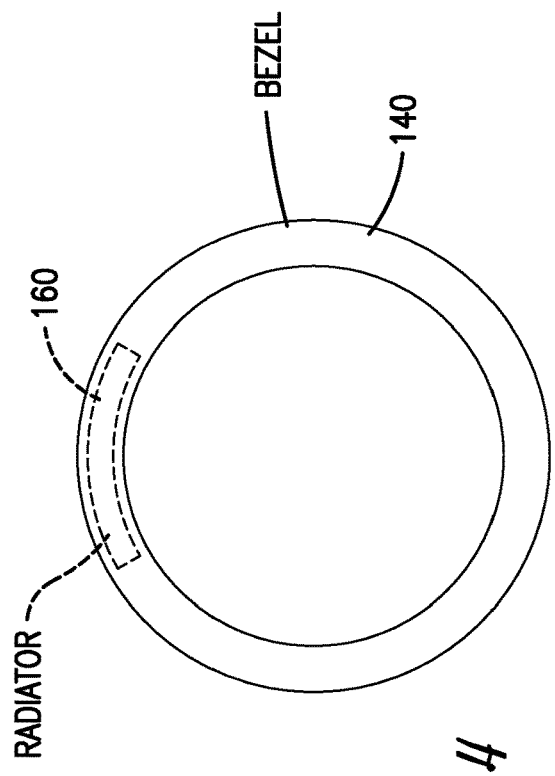
FIG. 14 is a schematic view of the bezel of the second embodiment of the wrist-worn electronic device illustrating the relative positioning of the bezel and the radiator.

Referring to FIGS. 13-15, a second embodiment of a wrist-worn electronic device 100 that transmits and receives wireless signals in two frequency bands is illustrated. The electronic device 100 broadly comprises at least a housing 112, a first frequency band element 122, a second frequency band element 124, a printed circuit board 130, a conductive element 132, a matching element 134, a diplexer 138, a bezel 140, and a tuning stub 144, each of which is substantially similar in structure and operation as the like-named components from the electronic device 10 described above. The electronic device 100 further comprises an antenna 142 and a radiator 160.

The first frequency band element 122 communicates a first electronic signal having a frequency in a first frequency band. In exemplary embodiments, the first frequency band element 122 includes a location determining element similar to the location determining element 18. And the first electronic signal is a location electronic signal. The second frequency band element 124 communicates a second electronic signal having a frequency in a second frequency band. In exemplary embodiments, the second frequency band element 124 includes a communication element similar to the communication element 20. And the second electronic signal is a communication electronic signal. The diplexer 138 multiplexes the first electronic signal and the second electronic signal into a third electronic signal which frequency and data components from each of the first electronic signal and the second electronic signal. The bezel 140 has a perimeter that varies according to a first wavelength of a first wireless signal having a frequency in the first frequency band. In exemplary embodiments, the bezel 140 may have a perimeter approximately equal to the first wavelength.

The radiator 160 is formed from electrically conductive material and, as shown in FIGS. 13 and 14, generally has a planar, block arcuate shape with an outer radius edge, an inner radius edge, and first and second opposing end edges. The shape of the radiator 160 may also be considered a portion of an annulus. The radiator 160 has a length that varies according to a wavelength, or a portion thereof, such as a quarter wavelength, of a second wireless signal having a frequency in the second frequency band. In exemplary embodiments, the radiator 160 may have a length approximately equal to a quarter wavelength of the second wireless signal. At one end, the radiator 160 includes a tab that extends downward away from the planar section. The tab may electrically connect to the printed circuit board 130 through a conductive element 132, similar to the conductive element 32. The radiator 160 is positioned adjacent a lower surface of the bezel 140 and parallel thereto with a small gap (of air or a non-conductive material) between the bezel 140 and the radiator 160. A portion of the bezel 140 overlaps the radiator 160.

The radiator 160 is in electronic communication with the diplexer 138, through the matching element 134, to communicate the third electronic signal, which includes the frequency components of the first electronic signal and the second electronic signal. In alternative embodiments, the radiator 160 may be in electronic communication with the first frequency band element 122 through a first matching element 134 and the second frequency band element 124 through a second matching element 134. The radiator 160 is capacitively coupled with the bezel 140 such that, at frequencies in the first frequency band and the second frequency band, the radiator 160 capacitively couples the third electronic signal between the bezel 140 and the matching element 134.

The antenna 142, as shown in FIGS. 13-15, operates in a substantially similar fashion as the antenna 42. Thus, the antenna 142 may transmit and receive a first wireless signal including a frequency in a first frequency band and, simultaneously, a second wireless signal including a frequency in a second frequency band. In exemplary embodiments, the antenna 142 receives a location wireless signal, such as a GNSS signal, including a frequency in a frequency band centered at approximately 1575 MHz. At the same time, the antenna 142 transmits and receives a communication wireless signal, such as Bluetooth™ and/or Wi-Fi, including a frequency in a frequency band centered at approximately 2.4 GHz.

In addition, the antenna 142 converts the first wireless signal into a corresponding first electronic signal and vice-versa, and the second wireless signal into a corresponding second electronic signal and vice-versa. Given that the antenna 142 typically transmits and/or receives the first wireless signal and the second wireless signal simultaneously, the antenna 142 converts and multiplexes the two wireless signals into a third electronic signal which includes frequency and data components from each of the first electronic signal and the second electronic signal. In exemplary embodiments, the antenna 142 converts and multiplexes the location wireless signal and the communication wireless signal into the third electronic signal which includes frequency and data components from the location electronic signal and the communication electronic signal.

The antenna 142 is typically configured or implemented as a loop antenna. Alternatively, the antenna 142 may be configured or implemented as a slot antenna, a microstrip antenna, a patch antenna, a linear antenna, an inverted F-antenna, an inverted L-antenna, a dipole antenna, or the like. The antenna 142 is formed from the conductive element 132, the radiator 160, and the bezel 140. The antenna 142 receives the location wireless signal and the communication wireless signal, either individually or in combination as the third electronic signal, from the printed circuit board 130. The signals flow through the conductive element 132 to the radiator 160. At high frequencies, such as at least the first frequency band centered at approximately 1575 MHz, the radiator 160 capacitively couples the signals to the bezel 140. The signals flow through the bezel 140 and then return to the printed circuit board 130 through the radiator 160 and the conductive element 132.

The tuning stub 144 may extend downward in a counter-clockwise fashion in the space between the lower surface of the bezel 140 and the printed circuit board 130. A second end of the tuning stub 144 is electrically isolated from an upper surface of the printed circuit board 130. In exemplary embodiments, the tuning stub 144 improves the performance of the antenna 142 receiving the right-hand polarization of the GNSS location wireless signal.

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

What is claimed is:

1. A wrist-worn electronic device configured to transmit and receive wireless signals in two frequency bands, the electronic device comprising:
   a housing including a bottom wall configured to contact a wearer's wrist, and a side wall with a lower edge coupled to a perimeter of the bottom wall;
   a bezel loop antenna configured to wirelessly receive a first electronic signal and a second electronic signal simultaneously, the bezel loop antenna formed from electrically conductive material, having a first impedance, and positioned above an upper surface of the side wall;
   a printed circuit board retaining an electrically conductive signal terminal electrically connected to a first contact point on a lower surface of the bezel loop antenna, an electrically conductive ground terminal electrically connected to a second contact point on the lower surface of the bezel loop antenna, and an electrically conductive tuning terminal electrically connected to a third contact point on the lower surface of the bezel loop antenna, the third contact point positioned between the first contact point and the second point in a counter-clockwise direction;

a first signal processing element retained on the printed circuit board and configured to process the first electronic signal having a frequency in a first frequency band;

a second signal processing element retained on the printed circuit board and configured to process the second electronic signal having a frequency in a second frequency band;

a diplexer retained on the printed circuit board, electrically connected to the first signal processing element, the second signal processing element and the signal terminal, the diplexer configured to:
receive the first electronic signal and the second electronic signal from the signal terminal, and
output the received first electronic signal to the first signal processing element and the received second electronic signal to the second signal processing element; and a tuning element retained on the printed circuit board and electrically connected to the tuning terminal and having a second impedance causing the bezel loop antenna to wirelessly receive electronic signals in the first frequency band and electronic signals in the second frequency band.

2. The wrist-worn electronic device of claim 1, further comprising:
a first electrically conductive element forming the electrical connection between the signal terminal and the first contact point on the bezel;
a second electrically conductive element forming the electrical connection between the ground terminal and the second contact point on the bezel loop antenna.

3. The wrist-worn electronic device of claim 1, wherein the first frequency band is centered at approximately 1575 megahertz, and the first signal processing element is further configured to determine a current geolocation of the electronic device based on the first electronic signal.

4. The wrist-worn electronic device of claim 1, wherein the second frequency band is centered at approximately 2.4 gigahertz, and the second signal processing element is a further configured to determine communication information based on the second electronic signal.

5. The wrist-worn electronic device of claim 1, wherein the first electronic signal is a global navigation satellite system signal and the second electronic signal is a communication signal.

6. The wrist-worn electronic device of claim 1, wherein the diplexer is further configured to receive the second electronic signal from the second signal processing element and output the second electronic signal to the signal terminal, and wherein the bezel loop antenna is further configured to wirelessly transmit the second electronic signal.

7. The wrist-worn electronic device of claim 1, further comprising a tuning stub electrically connected to the bezel and extending downward therefrom in a counter-clockwise fashion, the tuning stub formed of an electrically conductive material and configured to improve the radiation performance of the bezel loop antenna receiving the first electronic signal with a circular polarization.

8. The wrist-worn electronic device of claim 7, wherein the first electronic signal is received from a global navigation satellite system and the circular polarization is a right-hand polarization at the first frequency band.

9. A wrist-worn electronic device configured to transmit and receive wireless signals in two frequency bands, the electronic device comprising:
a housing including a bottom wall configured to contact a wearer's wrist, and a side wall with a lower edge coupled to a perimeter of the bottom wall;
a bezel loop antenna configured to wirelessly receive a first electronic signal and a second electronic signal simultaneously, the bezel loop antenna formed from electrically conductive material, having a first impedance, and positioned above an upper surface of the side wall;
a printed circuit board retaining an electrically conductive signal terminal electrically connected to a first contact point on a lower surface of the bezel loop antenna, an electrically conductive ground terminal electrically connected to a second contact point on the lower surface of the bezel loop antenna, and an electrically conductive tuning terminal electrically connected to a third contact point on the lower surface of the bezel loop antenna, the third contact point positioned between the first contact point and the second point in a counter-clockwise direction;
a location determining element retained on the printed circuit board and configured to receive the first electronic signal having a frequency in a first frequency band and determine a current geolocation of the electronic device based on the first electronic signal;
a communication element retained on the printed circuit board and configured to process a second electronic signal having a frequency in a second frequency band and determine data from a plurality of wireless communication protocols;
a diplexer retained on the printed circuit board, electrically connected to the location determining element, the communication element and the signal terminal, the diplexer configured to:
receive the first electronic signal and the second electronic signal from the signal terminal and output the received first electronic signal to the location determining element and the second electronic signal to the communication element, and
receive the second electronic signal from the communication element and output the second electronic signal to the signal terminal; and
a tuning element retained on the printed circuit board and electrically connected to the tuning terminal and having a second impedance causing the bezel loop antenna to wirelessly receive the first electronic signal in the first frequency band and the second electronic signal in the second frequency band;
wherein the bezel loop antenna is further configured to wirelessly transmit the second electronic signal.

10. The wrist-worn electronic device of claim 9, further comprising:
a first electrically conductive element forming the electrical connection between the signal terminal and the first contact point on the bezel;
a second electrically conductive element forming the electrical connection between the ground terminal and the second contact point on the bezel.

11. The wrist-worn electronic device of claim 9, wherein the first electronic signal is received from a global navigation satellite system and the second electronic signal is received from a mobile device.

12. The wrist-worn electronic device of claim 9, further comprising a tuning stub formed of electrically conductive material, the tuning stub electrically connected to the bezel and extending downward therefrom in a counter-clockwise fashion.

13. The wrist-worn electronic device of claim 12, wherein the tuning stub is configured to improve the performance of the bezel loop antenna receiving the first electronic signal with a right-hand circular polarization.

14. A wrist-worn electronic device configured to transmit and receive wireless signals in two frequency bands, the electronic device comprising:
a housing including a bottom wall configured to contact a wearer's wrist, and a side wall including a lower edge coupled to a perimeter of the bottom wall and an inner surface;
a bezel loop antenna including a portion extending in a counter-clockwise direction between a signal terminal and an electrically conductive ground terminal and configured to wirelessly receive a first electronic signal and a second electronic signal simultaneously, the bezel loop antenna formed from electrically conductive material, having a tuning stub contacting a lower surface of the bezel loop antenna at a point along the portion extending between the signal terminal and the electrically conductive ground terminal in the counter-clockwise direction, and positioned above an upper surface of the side wall;
a location determining element configured to receive the first electronic signal including a frequency in a first frequency band and determine a current geolocation of the electronic device based on the first electronic signal;
a communication element configured to process a second electronic signal including a frequency in a second frequency band and determine communication information based on the second electronic signal; and
a diplexer electrically connected to the location determining element, the communication element and the bezel loop antenna, the diplexer configured to receive the first electronic signal and the second electronic signal from the signal terminal of the bezel loop antenna and output the received first electronic signal to the location determining element and the second electronic signal to the communication element;
wherein the tuning stub is positioned against the inner surface of the side wall and extends downward from the bezel loop antenna in a counter-clockwise fashion and causes the bezel loop antenna to have a right-hand circular polarization at the first frequency band.

15. The wrist-worn electronic device of claim 14, wherein a first end of the tuning stub contacts the lower surface of the bezel loop antenna.

16. The wrist-worn electronic device of claim 15, further comprising a printed circuit board including a plurality of electrically conductive terminals, wherein a second end of the tuning stub is positioned along an inner surface of the side wall above the printed circuit board.

17. The wrist-worn electronic device of claim 16, wherein the second end of the tuning stub is positioned in a counterclockwise position relative to the first end of the tuning stub.

18. The wrist-worn electronic device of claim 16, wherein the second end of the tuning stub is electrically isolated from the printed circuit board.

19. The wrist-worn electronic device of claim 16, further comprising a tuning element retained on the printed circuit board and electrically connected to one of the plurality of electrically conductive terminals, wherein the tuning element introduces a second resonance causing the bezel loop antenna to wirelessly receive electronic signals in the first frequency band and electronic signals in the second frequency band simultaneously.

20. The wrist-worn electronic device of claim 14, wherein the tuning stub is formed of an electrically conductive material.

* * * * *